United States Patent
Chiu et al.

(10) Patent No.: US 8,985,545 B2
(45) Date of Patent: Mar. 24, 2015

(54) SUPPORTING ASSEMBLY FOR ELECTRONIC DEVICE

(75) Inventors: Chuan-Hsiao Chiu, New Taipei (TW); Chen-Ming Chan, New Taipei (TW); Xiang-Lin Xue, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 13/415,360

(22) Filed: Mar. 8, 2012

(65) Prior Publication Data

US 2013/0075550 A1    Mar. 28, 2013

(30) Foreign Application Priority Data

Sep. 28, 2011  (CN) .......................... 2011 1 0301514

(51) Int. Cl.
- *A47B 91/00* (2006.01)
- *F16M 13/00* (2006.01)
- *G06F 1/16* (2006.01)
- *H05K 5/02* (2006.01)
- *G06F 1/18* (2006.01)

(52) U.S. Cl.
CPC ............ *G06F 1/1656* (2013.01); *H05K 5/0234* (2013.01); *G06F 1/181* (2013.01)
USPC ..................... 248/635; 248/188.8; 248/188.9; 248/615; 248/677

(58) Field of Classification Search
USPC ........... 248/188.1, 188.8, 188.9, 346.05, 615, 248/618, 634, 635, 677, 687
See application file for complete search history.

(56) References Cited

U.S. PATENT DOCUMENTS

| | | | | |
|---|---|---|---|---|
| 630,128 A | * | 8/1899 | Stock | 248/188.9 |
| 780,684 A | * | 1/1905 | Pratt | 248/188.9 |
| 1,124,828 A | * | 1/1915 | Woodward | 248/615 |
| 1,587,484 A | * | 6/1926 | Holden | 248/635 |
| 1,864,125 A | * | 6/1932 | Dowd | 248/615 |
| 1,962,547 A | * | 6/1934 | Zerk | 248/188.8 |
| 2,291,430 A | * | 7/1942 | Ingersoll | 174/154 |

(Continued)

FOREIGN PATENT DOCUMENTS

| | | | | |
|---|---|---|---|---|
| JP | 2005090681 A | * | 4/2005 | F16B 5/02 |
| TW | M277236 U | | 10/2005 | |

(Continued)

OTHER PUBLICATIONS

Taiwan Patent Office, Office Action, Patent Application Serial No. TW100136960, Sep. 30, 2013, Taiwan.

*Primary Examiner* — Joshua J Michener
*Assistant Examiner* — Chiedu Chibogu
(74) *Attorney, Agent, or Firm* — Rabin & Berdo, P.C.

(57) ABSTRACT

A supporting assembly is disposed to a case of an electronic device. A window is formed on the case for communicating an inner surface and an outer surface of the case. The supporting assembly includes a fixed part, a latching post, and a support body. The fixed part is disposed to the inner surface. The latching post includes a fixing end and an inserting end. The fixing end runs through the window and is fixed to the fixed part. A first stopping block is disposed to the inserting end. The support body includes a supporting side and a combination side. A combination hole is formed at the combination side for the inserting end to insert therein. The support body further includes a second stopping block protrudly disposed in the combination hole, for stopping the first stopping block to prevent the inserting end from escaping from the combination hole.

5 Claims, 9 Drawing Sheets

(56) References Cited

U.S. PATENT DOCUMENTS

| | | | | |
|---|---|---|---|---|
| 2,458,621 | A * | 1/1949 | Miller | 16/42 T |
| 2,699,567 | A * | 1/1955 | Kramcsak, Jr. | 16/42 R |
| 2,710,027 | A * | 6/1955 | Husgen et al. | 138/89 |
| 2,860,368 | A * | 11/1958 | Thornsbury | 16/42 R |
| 2,944,367 | A * | 7/1960 | Bontecue | 248/188.3 |
| 3,025,557 | A * | 3/1962 | Knowlton | 16/42 R |
| 3,243,206 | A * | 3/1966 | Samer | 285/154.1 |
| 3,335,989 | A * | 8/1967 | Bachmann | 248/158 |
| 3,575,288 | A * | 4/1971 | Brucken | 206/320 |
| 3,722,026 | A * | 3/1973 | Wilhelmi | 16/42 T |
| 4,216,930 | A * | 8/1980 | Rossler et al. | 248/56 |
| 4,576,357 | A * | 3/1986 | Schrepfer | 248/662 |
| 4,718,631 | A * | 1/1988 | Reynolds et al. | 248/615 |
| 4,923,158 | A * | 5/1990 | Saisho | 248/188.8 |
| 5,010,621 | A * | 4/1991 | Bock | 16/39 |
| 5,153,052 | A * | 10/1992 | Tanaka et al. | 428/212 |
| 5,165,636 | A * | 11/1992 | Grissom | 248/188.3 |
| 5,170,972 | A * | 12/1992 | Casals Guell | 248/188.9 |
| 5,295,652 | A * | 3/1994 | Byrne | 248/635 |
| 5,613,406 | A * | 3/1997 | Rutkowski | 74/502.6 |
| 5,871,199 | A * | 2/1999 | Koike et al. | 248/638 |
| 5,921,516 | A * | 7/1999 | Ho | 248/206.5 |
| 5,959,642 | A * | 9/1999 | Fujioka et al. | 347/37 |
| 5,988,574 | A * | 11/1999 | Podgorski et al. | 248/188.4 |
| 6,024,338 | A * | 2/2000 | Koike et al. | 248/638 |
| 6,088,877 | A * | 7/2000 | Swy et al. | 16/42 T |
| 6,405,982 | B2 * | 6/2002 | Ferencz | 248/188.9 |
| 6,471,179 | B1 * | 10/2002 | Tousi et al. | 248/635 |
| 6,520,459 | B2 * | 2/2003 | Burr | 248/188.4 |
| 6,520,464 | B1 * | 2/2003 | Morrissey et al. | 248/222.52 |
| 6,592,285 | B1 * | 7/2003 | Schwarz | 403/179 |
| 6,742,750 | B2 * | 6/2004 | Burr | 248/188.4 |
| 6,883,530 | B2 * | 4/2005 | Kawakami | 135/84 |
| 6,915,993 | B2 * | 7/2005 | O'Leary | 248/188.9 |
| 6,942,255 | B2 * | 9/2005 | Pickering | 285/136.1 |
| 7,210,255 | B2 * | 5/2007 | Blackburn | 40/209 |
| 7,287,732 | B2 * | 10/2007 | Balistreri | 248/188.4 |
| 7,427,052 | B2 * | 9/2008 | Cha et al. | 248/188.8 |
| 7,533,858 | B2 * | 5/2009 | Straus | 248/188.8 |
| D617,631 | S * | 6/2010 | Bushey et al. | D8/374 |
| 7,817,418 | B2 * | 10/2010 | Bailey | 361/679.59 |
| 8,220,770 | B2 * | 7/2012 | Justis | 248/677 |
| 8,234,751 | B2 * | 8/2012 | Bushey et al. | 16/42 R |
| 8,278,551 | B2 | 10/2012 | Fan | |
| 8,794,584 | B2 * | 8/2014 | Shimada et al. | 248/635 |
| 2002/0117590 | A1 * | 8/2002 | Araki | 248/188.8 |
| 2003/0016493 | A1 * | 1/2003 | Hiratomo et al. | 361/685 |
| 2004/0168464 | A1 * | 9/2004 | Seo et al. | 62/295 |
| 2005/0103966 | A1 * | 5/2005 | Kim | 248/346.05 |
| 2006/0131466 | A1 * | 6/2006 | Cha et al. | 248/188.8 |
| 2007/0103859 | A1 * | 5/2007 | Yu | 361/683 |
| 2008/0251663 | A1 * | 10/2008 | Tracy et al. | 248/188.8 |
| 2009/0189051 | A1 * | 7/2009 | Love | 248/635 |
| 2011/0102981 | A1 * | 5/2011 | Chen | 361/679.01 |
| 2012/0223211 | A1 * | 9/2012 | Mayr et al. | 248/634 |

FOREIGN PATENT DOCUMENTS

| | | |
|---|---|---|
| TW | M351582 U | 2/2009 |
| TW | 201108911 A | 3/2011 |

* cited by examiner

SUPPORTING ASSEMBLY FOR ELECTRONIC DEVICE

CROSS-REFERENCES TO RELATED APPLICATIONS

This non-provisional application claims priority under 35 U.S.C. §119(a) on Patent Application No. 201110301514.7 filed in China on 2011 Sep. 28, the entire contents of which are hereby incorporated by reference.

BACKGROUND

1. Technical Field

This disclosure relates to support pads disposed on the bottom of an electronic device, and more particularly to a supporting assembly able to be installed/removed quickly without tools.

2. Related Art

Support pads are usually disposed on the bottom of a case of a desktop/laptop computer for anti-slip and vibration-isolation purposes. Generally, a support pad is made of elastic material, such as rubber, sponge foam, etc. When the support pad made of rubber or sponge foam contacts the surface of a desk, frictional force is generated so as prevent the case of the computer from slipping on the desk. Meanwhile, the support pad made of rubber or sponge foam is deformable to absorb shock, so as to isolate shock/vibration from the desk and protect the computer. Furthermore, the computer is separated from the desk by the support pad to maintain a gap between the computer and the desk, enhancing heat dissipation rate at the bottom of the computer.

In general, a support pad is a small circular/rectangular slice adhered to the bottom of the case through the adhesive agent. Since the used adhesive agent can not be used again new adhesive agent is required for attaching the support pad to the case if the support pad is removed. In order to prevent the support pad from falling off, strong adhesive agent is typically used. If the support pad is attached using strong adhesive agent, the support pad would be damaged easily when removed from the case. As a result of the strong adhesive agent, the support in the art cannot be reused.

R. O. C. (Taiwan) Utility Model Patent M351582 discloses "Flexible foot pad and electronic device equipped therewith". In M351852, a through hole is formed on the support pad, and a screw runs through the through hole and is fixed to the bottom of the case. In M351852, the supports pads are reusable, but tools are required to install/uninstall the support pads. Screw heads are always exposed on the bottom of the case, and affect the computer's appearance negatively.

R. O. C. (Taiwan) Utility Model Patent M277236" discloses "Assembled Foot Pad". In M277236, a cylindrical main-body is fixed on the case first, and a sleeve body then slips over the main-body to form the "Assembled Foot Pad" without an exposed screw head.

SUMMARY

Problems exist in the art of the support pad structure; inability of reuse, tools required, and negatively affected appearance resulting from exposure of screws.

This disclosure is directed to a supporting assembly for an electronic device in which the support body is able to be installed to or removed from the case without tools, and the problem of damaging the support body when removing the support body is avoided efficiently.

At least one embodiment of this disclosure provides a supporting assembly for an electronic device, wherein the supporting assembly is used to be disposed to a case of the electronic device. A window is formed on the case for communicating an inner surface and an outer surface of the case. The supporting assembly includes a fixed part, a latching post, and a support body.

The fixed part is disposed to the inner surface of the case and located corresponding to the window. The latching post includes a fixing end and an inserting end, wherein the fixing end runs through the window from the outer surface of the case and is fixed to the fixed part, and a first stopping block is protrudly disposed to the inserting end. The support body includes a supporting side and a combination side opposite to each other, wherein a combination hole is formed at the combination side for the inserting end of the latching post to insert therein. The support body further includes a second stopping block. The second stopping block is protrudly disposed on the inner wall of the combination hole for stopping the first stopping block of the latching post, so as to prevent the inserting end from escaping from the combination hole.

At least one embodiment of this disclosure provides a supporting assembly for an electronic device, wherein the supporting assembly is used to be disposed to a case of the electronic device. An inserting hole is formed on the case for communicating an inner surface and an outer surface of the case. The supporting assembly includes a latching post and a support body.

The latching post includes a fixing end and an inserting end, wherein the fixing end of the latching post inserts into the inserting hole on the outer surface of the case and is fixed to the outer surface of the case. A first stopping block is disposed to the inserting end. The support body includes a supporting side and a combination side opposite to each other, wherein a combination hole is formed at the combination side for the inserting end of the latching post to insert therein. The support body further includes a second stopping block. The second stopping block is protrudly disposed on the inner wall of the combination hole for the purpose of stopping the first stopping block of the latching post, so as to prevent the inserting end from escaping from the combination hole.

Through the support body combined with the latching post, the support body is able to be installed to or removed from the case without tools, so as to form the supporting assembly. The support body is combined with the latching post through the deformation of the support body, therefore tools are not required when installing to or removing the supporting body from the case, and the problem of damaging the support body when removing the support body is efficiently avoided. Furthermore, the support body covers the other parts of the supporting assembly, thus avoiding the structure that negatively affects the appearance of the case, from being exposed.

BRIEF DESCRIPTION OF THE DRAWINGS

This disclosure will become more fully understood from the detailed description given herein below for illustration only and thus not limitative of this disclosure, wherein.

DETAILED DESCRIPTION

Figure 1:
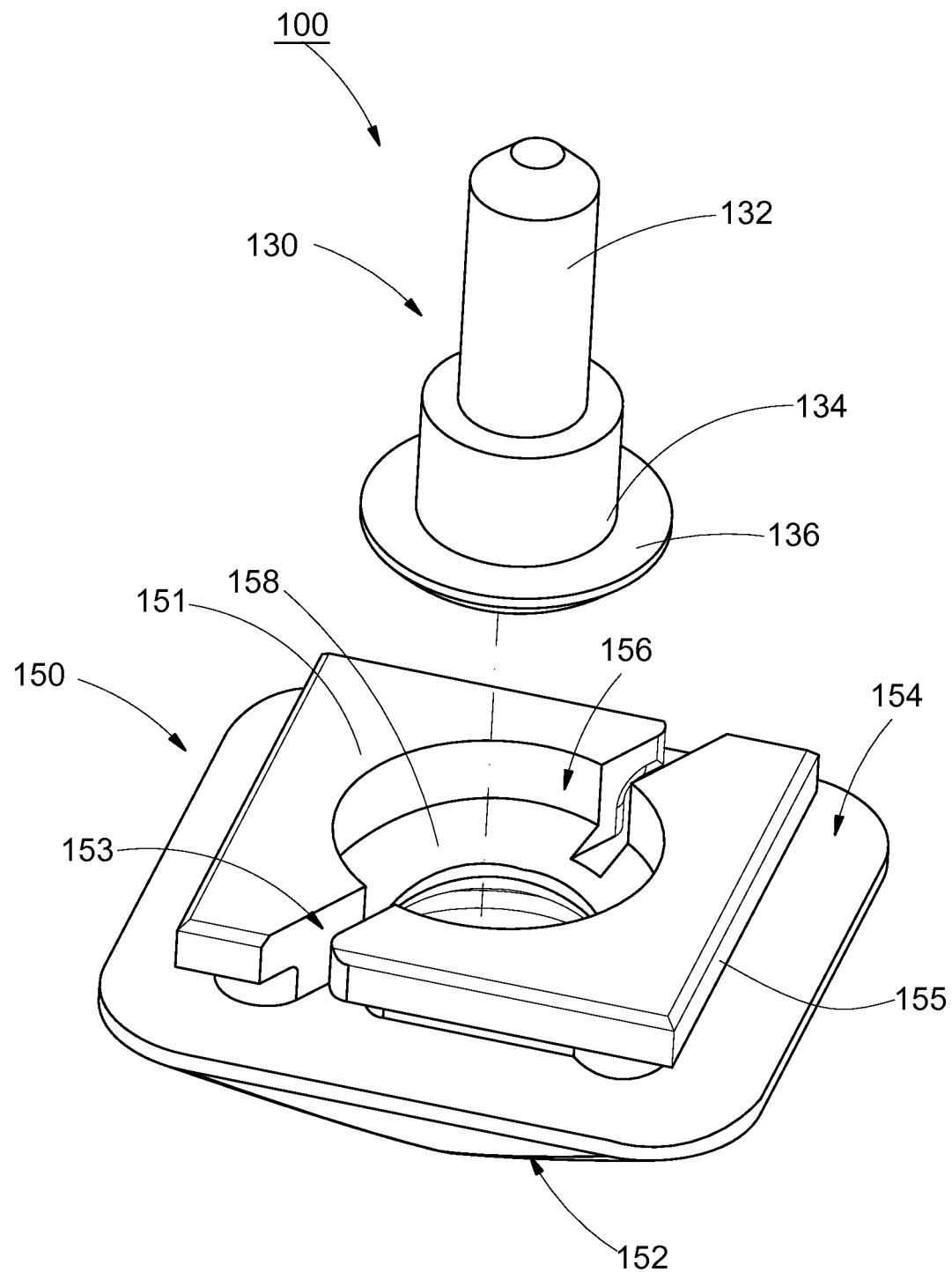
FIG. 1 is a partial exploding view of an embodiment.
Figure 2:
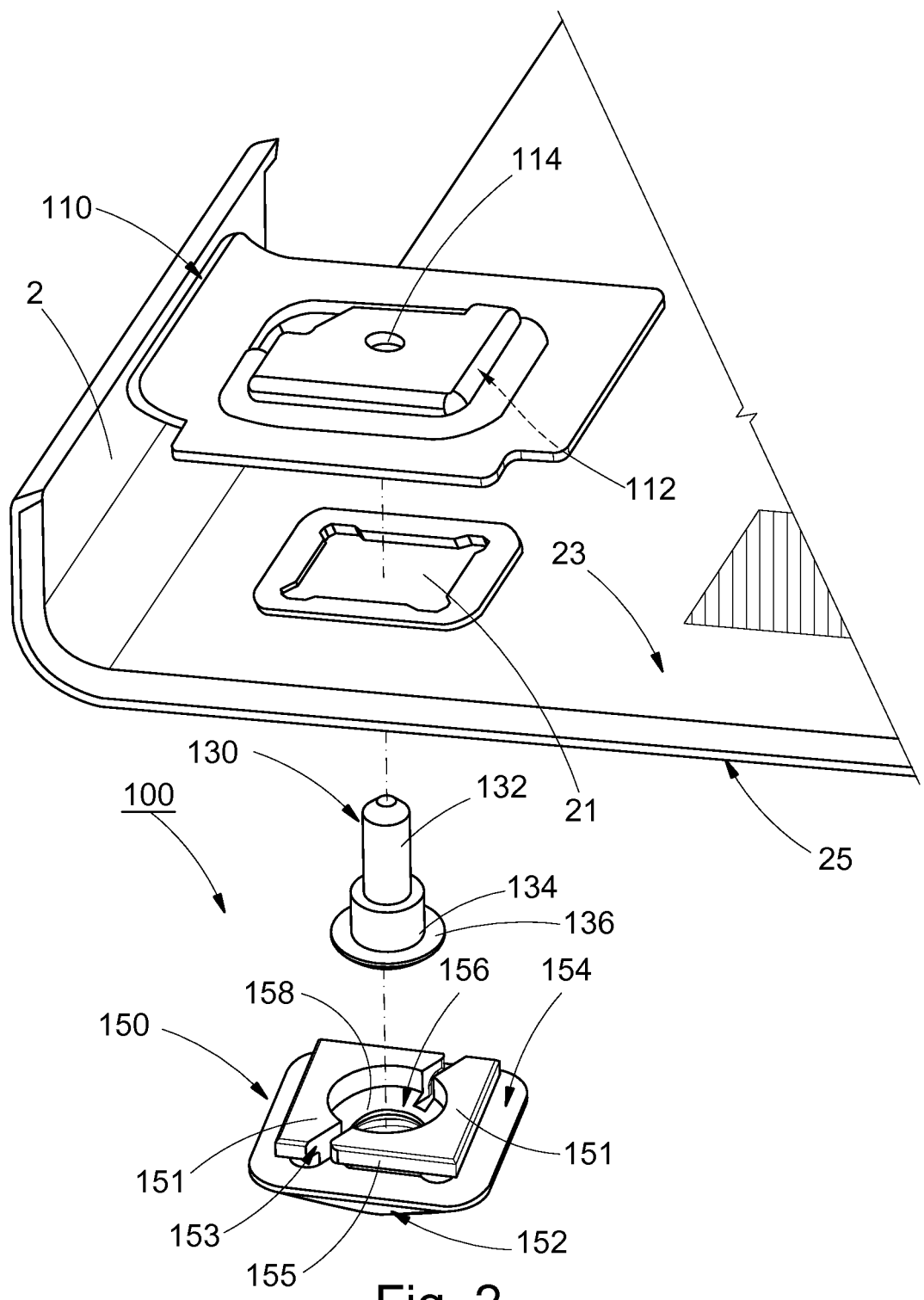
FIG. 2 is an exploded view of a supporting assembly according to the embodiment.
Figure 3:
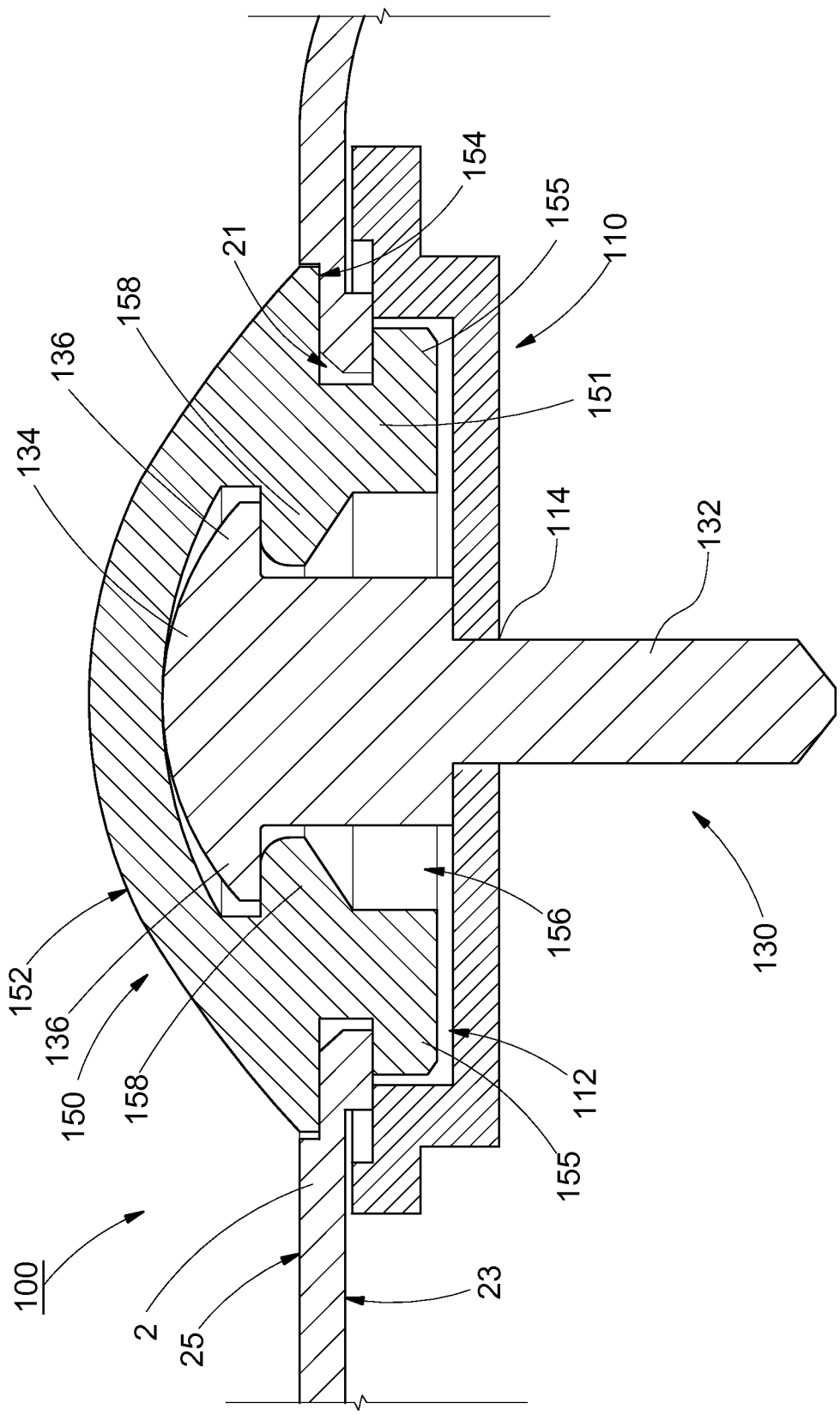
FIG. 3 is a cross-sectional view of the supporting assembly according to the embodiment.

Please refer to FIGS. 1, 2, and 3, in which a supporting assembly 100 according to an embodiment of this disclosure is illustrated. The supporting assembly 100 is used to be disposed to a case 2 of the electronic device.

Examples of the electronic device include desktop computers, laptop computers, and handheld devices, etc. A window 21 is formed on the case 2 for communicating an inner surface 23 and an outer surface 25 of the case 2. The supporting assembly 100 includes a fixed part 110, a latching post 130, and a support body 150.

Please refer to FIGS. 2 and 3, in which the fixed part 110 is disposed to the inner surface 23 of the case 2 and located corresponding to the window 21. The fixed part 110 is fixed to the inner surface 23 of the case 2 through adhering, welding, etc. In another example, a latching structure is utilized for latching the fixed part 110 to the case 2, so as to fixing the fixed part 110 to the inner surface 23.

Figure 4:
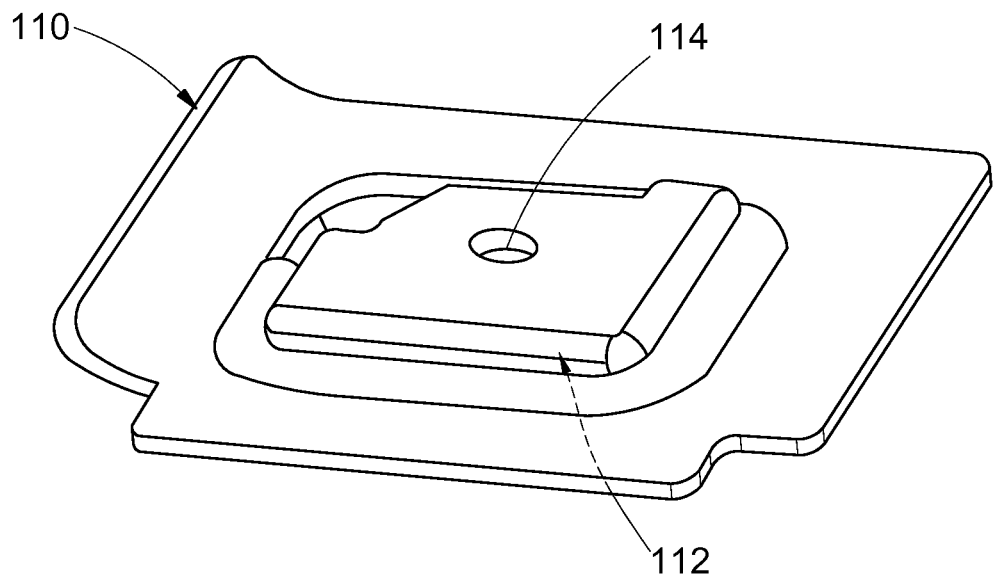
FIG. 4 is a perspective view of the fixed part according to the embodiment.
Figure 5:
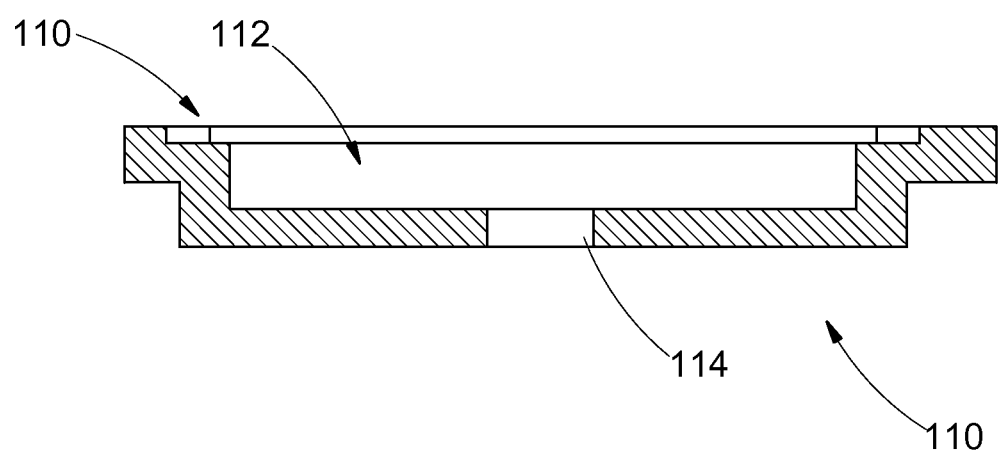
FIG. 5 is a cross-sectional view of the fixed part according to the embodiment.

Please refer to FIGS. 4 and 5; in an example the fixed part 110 is a slice, which is a metal stamping part or plastic injection part. A depression 112 is formed on the fixed part 110, and the depression 112 faces the inner surface 23 of the case 2. Furthermore, a fixing hole 114 is formed on the fixed part 110, and the fixing hole 114 is located at the bottom of the depression 112 and runs through the fixed part 110.

Please refer to FIGS. 1, 2, and 3, in which the latching post 130 includes a fixing end 132 and an inserting end 134. The fixing end 132 runs through the window 21 from the outer surface 25 of the case 2 and is fixed to the fixed part 110. A first stopping block 136 is protrudly disposed to the inserting end 134. In an example, the first stopping block 136 is a flange, continuously or discontinuously disposed on the peripheral surface of the inserting end 134.

The latching post 130 is a screw bolt. A screw thread is formed on peripheral surface of the fixing end 132, and the fixing hole 114 is a screw hole matching the fixing end 132. The first stopping block 136 is the head of the screw bolt. Consequently, the equivalent diameter of the latching post 130 obtained around the first stopping block 136 is larger than the equivalent diameter obtained around the other portion of the latching post 130.

Please refer to FIGS. 1, 2, and 3, in which the support body 150 is made of elastic material, such as rubber, sponge foam, and etc. The support body 150 is able to be deformed, so as to combine the support body 150 with the latching post 130 or remove the support body 150 from the latching post 130 without damaging the support body 150. Through deformation, the support body 150 absorbs or isolates shock/vibration, so as to provide anti-vibration function to protect the electronic device.

Figure 6:
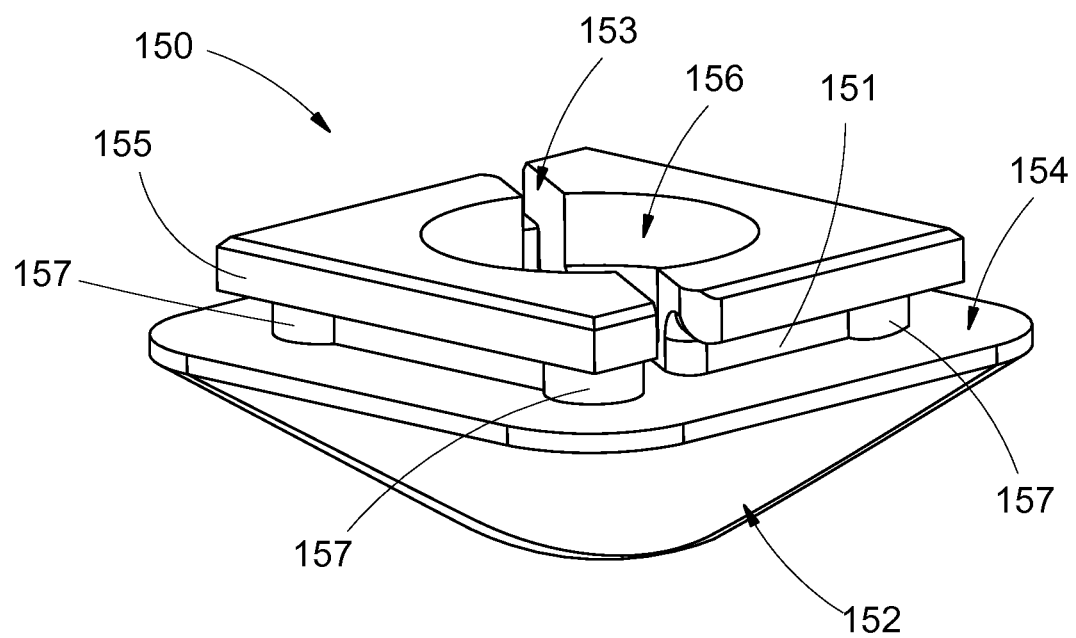
FIG. 6 is a perspective view of the support body according to the embodiment.
Figure 7:
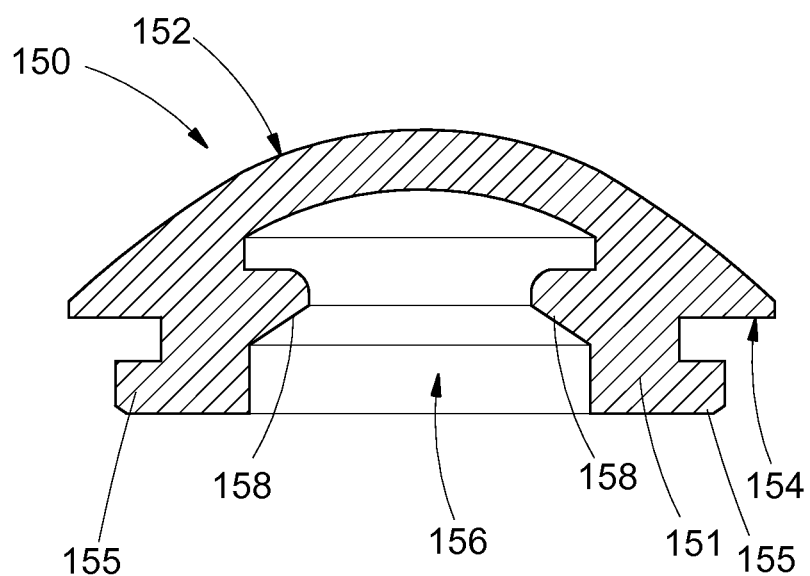
FIG. 7 is a cross-sectional view of the support body according to the embodiment.

Please refer to FIGS. 3, 6, and 7, in which the support body 150 includes a supporting side 152 and a combination side 154 opposite to each other. A bumping structure is formed on the supporting side 152, such as a convex surface, for contacting a placement surface, so as to support the electronic device on the placement surface through the support body 150. A combination hole 156 is formed at the combination side 154, for the inserting end 134 of the latching post 130 to insert therein. Furthermore, the support body 150 further includes a second stopping block 158. The second stopping block 158 is protrudly disposed on the inner wall of the combination hole 156. When the inserting end 134 of the latching post 130 inserts the combination hole 156, the second stopping block 158 stops the first stopping block 136 of the latching post 130, so as to avoid the inserting end 134 of the latching post 130 from escaping from the combination hole 156.

Figure 8:
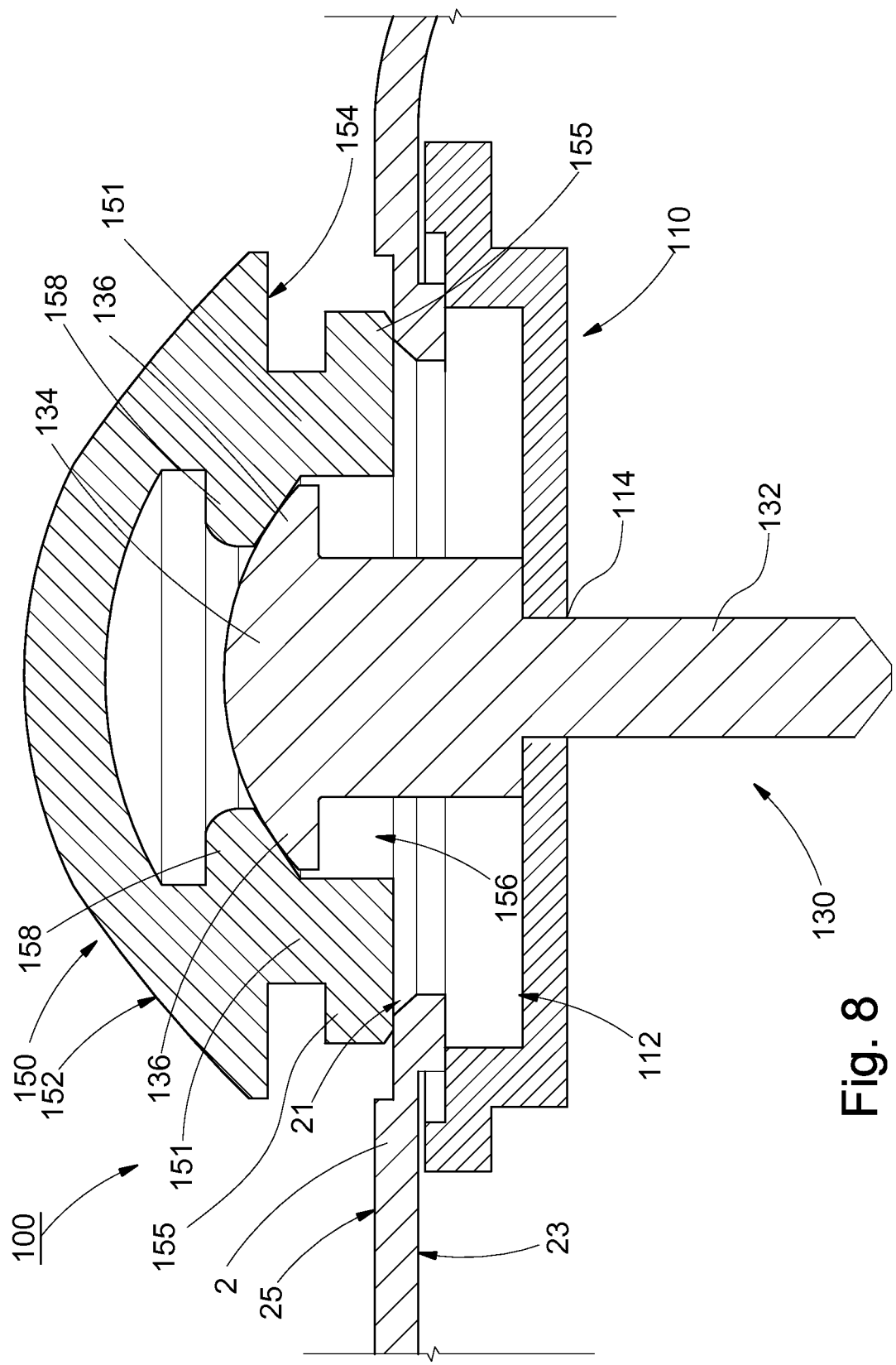
FIG. 8 and FIG. 9 are cross-sectional views of the supporting assembly according to the embodiment.
Figure 9:
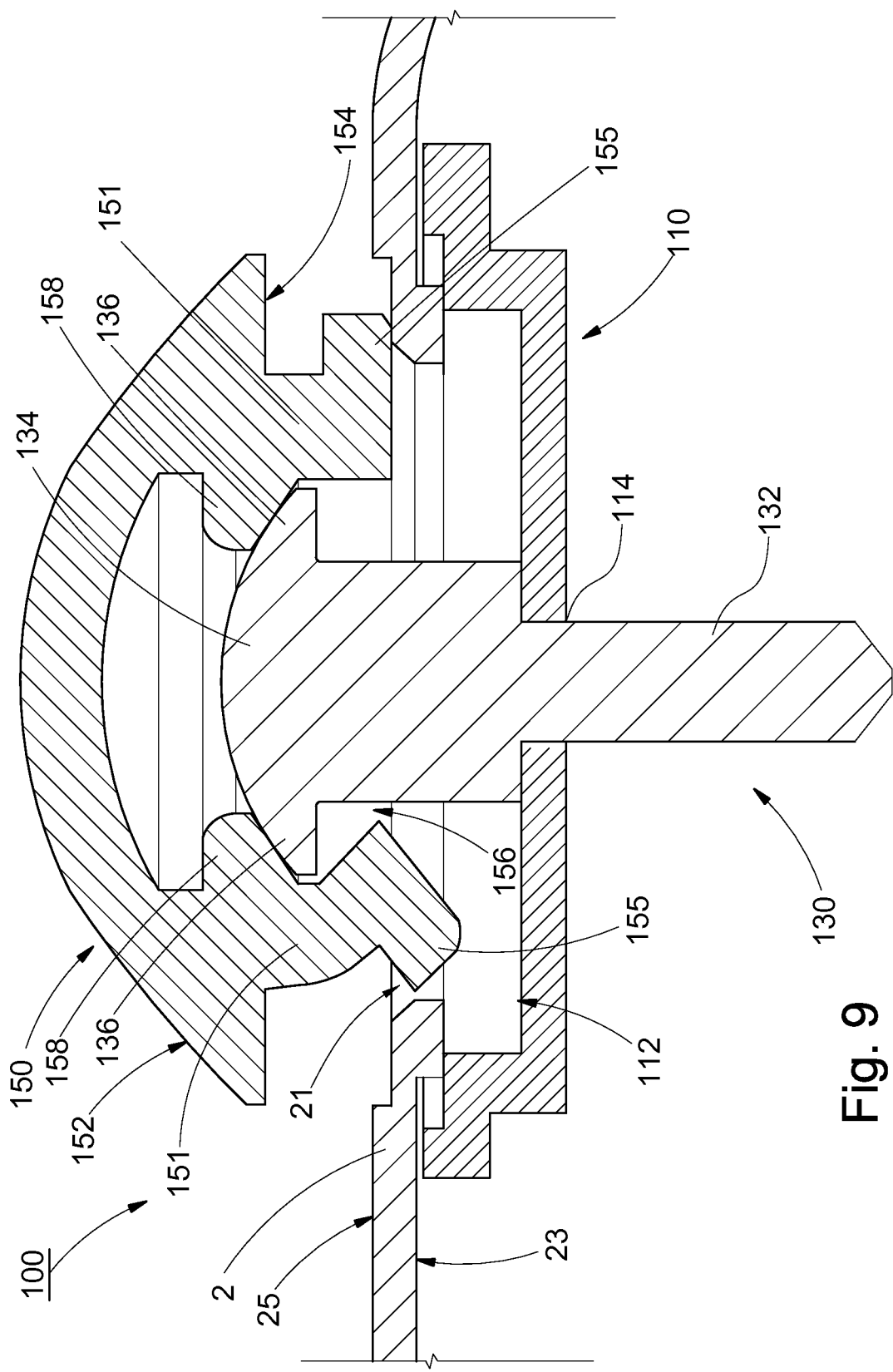

Please refer to FIGS. 8 and 9; generally the supporting assembly 100 is disposed on the bottom surface of the electronic device; the outer surface 25 of the case 2 is the bottom surface of the electronic device. When installing the supporting assembly 100, the fixed part 110 is fixed to the inner surface 23 of the case 2 at first, so as to cover the window 21 of the case 2 with the fixed part 110. Meanwhile, the fixing hole 114 is located corresponding to the window 21.

Next, the fixing end 132 runs through the window 21 from the outer surface 25 of the case 2 and inserts the fixing hole 114, so as to fix the latching post 130 to the fixed part 110 through the fixing end 132. As described above, in one example the latching post 130 is a screw bolt, a screw thread is formed on peripheral surface of the fixing end 132, and the fixing hole 114 is a screw hole, so that the fixing end 132 is able to be screwed into the fixing hole 114 to fix the latching post 130 to the fixed part 110. At this time, the inserting end 134 runs through the case 2 via the window 21 and protrudes on the outer surface 25 of the case 2.

Please refer to FIG. 8, in which the support body 150 is then placed on the outer surface 25 of the case 2 with the combination side 154 facing the window 21 and the combination hole 156 aligned with the inserting end 134.

Please refer to FIG. 9, in which when pressing the support body 150 against the case 2, the inserting end 134 moves into the combination hole 156. Since the support body 150 is made of elastic material, the second stopping block 158 squeezes the first stopping block 136 when the first stopping block 136 contacts the second stopping block, so as to deform the first stopping block 136 and the second stopping block 158 runs over the first stopping block 136.

Please refer to FIG. 3, in which after the second stopping block 158 runs over the first stopping block 136, the first stopping block 136 recovers and the second stopping block 158 stops the first stopping block 136 of the latching post 130, so as to avoid the inserting end 134 of the latching post 130 from escaping from the combination hole 156.

When the support body 150 is combined with the latching post 130, the window 21, latching post 130, and the fixed part 110 of the case 2 is covered by the support body 150, so as to avoid the structure that negatively affects the appearance outer surface 25 of the case 2, from being exposed.

In addition to the second stopping block 158 stopping the first stopping block 136 of the latching post 130, in one example the inner diameter of the combination hole 156 is smaller than the outer diameter of the inserting end 134, so that the inserting end 134 is combined within the combination hole 156 in an interference fit manner.

Please refer to FIGS. 6 and 7, in which the support body 150 further includes a lug-boss 151 protruding on the combination side 154. The combination hole 156 is formed on the top of the lug-boss 151 and extends into the interior of the support body 150. The configuration of the cross section of the lug-boss 151 matches the window 21 of the case 2, so that the lug-boss 151 is able to run through the window 21 and located in the window 21. In order to increase the deformation of the combination hole 156 and the first stopping block 136, a cut-through slot 153 is formed on the support body 150. The cut-through slot 153 separates the lug-boss 151 into two parts by cutting the lug-boss 151 along an axial direction of the combination hole 156. The rigidity of the lug-boss 151 along the radial directions of the combination hole 156 is decreased by the cut-through slot 153, therefore the combination hole 156 is easily to be deformed in radial directions to move the first stopping block 136 along radial directions. Thus it is more easily to install/remove the support body 150, and the probability of damaging the support body 150 in installing/removing process is reduced.

A third stopping block 155 is further protrudly disposed at the edge of the top of the lug-boss 151. In an example, the third stopping block 155 is a flange, continuously or discontinuously disposed around the top of the lug-boss 151. The opening of the depression 112 of the fixed part 110 is large then the window 21 and configuration of the opening of the depression 112 matches the configuration of the third stopping block 155, such that the portion of the case 2 around the window 21 forms a flange corresponding to the depression 112.

The third stopping block 155 is also deformable. The third stopping block 155 runs through the window 21 to be located in the depression 112 and to press against the inner surface 23 of the case 2. Through the third stopping block 155, the support body 150 tightly contacts the outer surface 25 of the case 2, and the occurrence rate of edge warping on the edge of the support body 150 is reduced.

In order to further reduce the occurrence rate of edge warping of the support body 150, the lug-boss 151 further includes a plurality of ribs 157. Each rib 157 extends along a direction parallel to the axial direction of the combination hole 156 and connects the third stopping block 155 and the combination side of the lug-boss 151. The cross section of each rib 157 is not limited; an example of the cross section of each rib 157 is a circle. The ribs 157 increase the rigidity of the third stopping block 158 in the axial direction of the combination hole 156, so as to reduce the occurrence rate of edge warping of the support body 150 result of the deformation of the third stopping block 155.

When removing the support body 150, for example the support body 150 is damaged and replacement is required, the support body 150 can be removed by pulling the support body 150 without tools. Simply pulling the support body 150 to deform the support body 150 around the combination hole 156 and deform the first stopping block 136, the second stopping block 158 will run over the first stopping block 136 and then the support body 150 is separated from the latching post 130. Even the support body 150 is removed and reinstalled instead of replacing the support body 150 with a new one, the support body 150 is repeatedly deformed without being damaged, so that the support body of the this disclosure is able to be reused.

Figure 10:
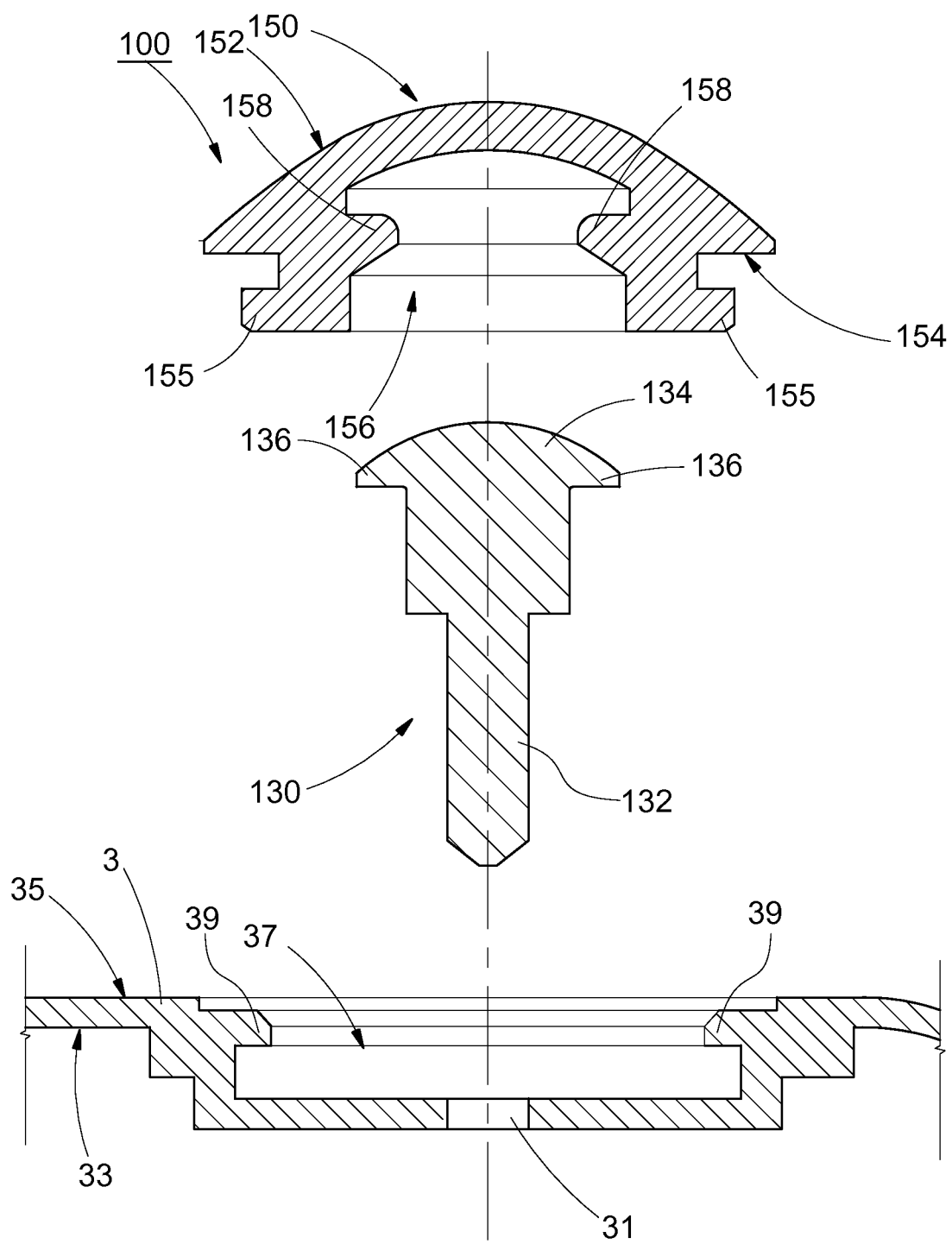
FIG. 10 and FIG. 11 are cross-sectional views of a supporting assembly according to another embodiment.
Figure 11:
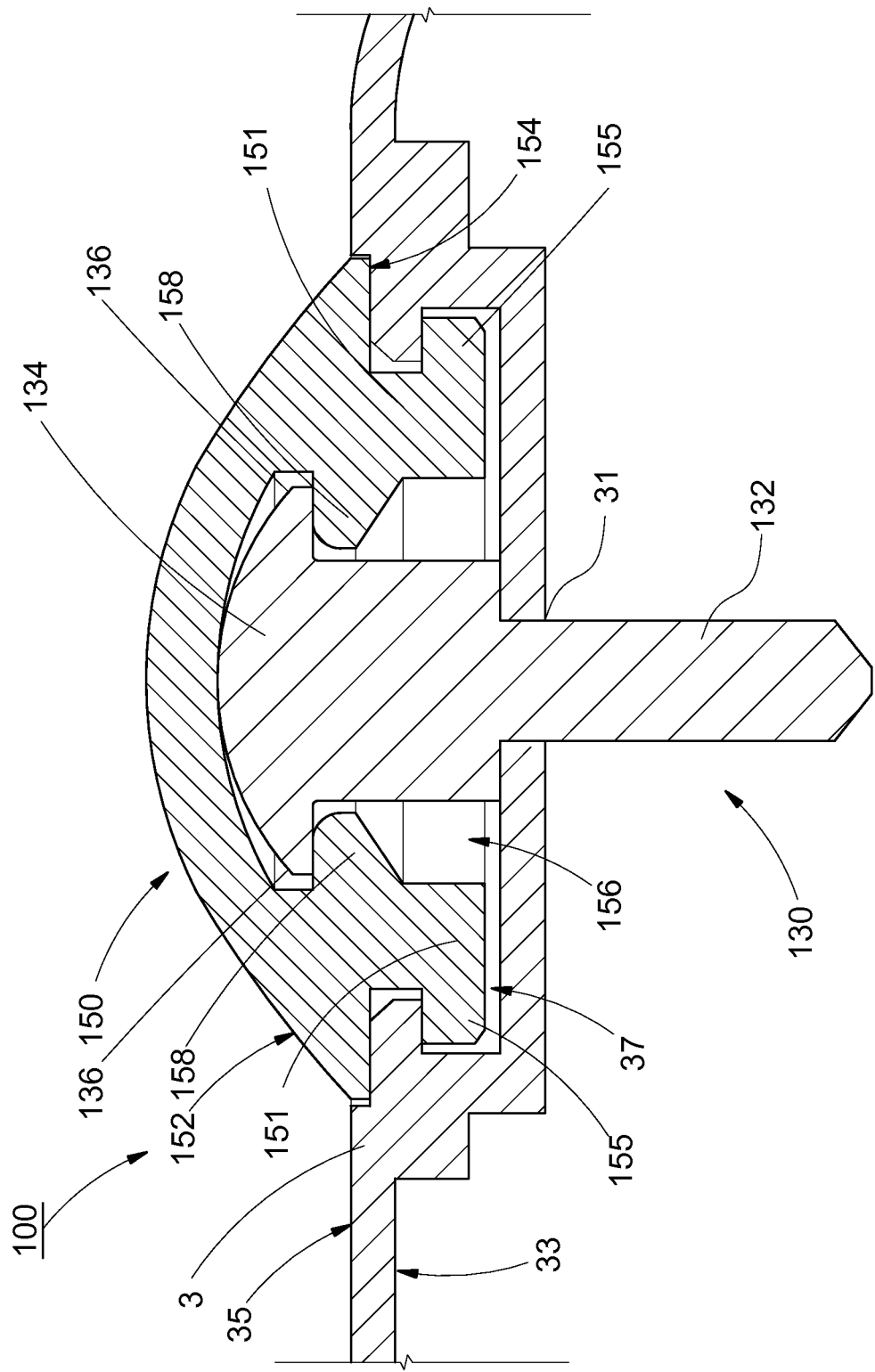

Please refer to FIGS. 10 and 11, in which a supporting assembly 100 according to another embodiment of this disclosure is illustrated. The supporting assembly 100 is used to be disposed to a case 3 of the electronic device.

An inserting hole 31 is formed on the case 3 for communicating an inner surface 33 and an outer surface 35 of the case 3. The supporting assembly 100 includes a latching post 130 and a support body 150. The latching post 130 and the support body 150 are substantially identical to those of the above-described embodiment.

Please refer to FIGS. 10 and 11, in which a trough 37 is formed on the outer surface 35 of the case 3, and the inserting hole 31 is located at the bottom of the trough 37 and runs through the case 3.

Please refer to FIGS. 10 and 11, in which the fixing end 132 of the latching post 130 inserts into the inserting hole 31 on the outer surface 35 of the case 3 to fix the latching post 130 on the outer surface 35 of the case 3 the fixing end 132 is located in the trough 37.

An example of the latching post 130 is a screw bolt. A screw thread is formed on peripheral surface of the fixing end 132, and the inserting hole 31 is a screw hole matching the fixing end 132. The first stopping block 136 is the head of the screw bolt. Therefore, the equivalent diameter of the latching post 130 obtained around the first stopping block 136 is larger than the equivalent diameter obtained around the other portion of the latching post 130.

Please refer to FIGS. 10 and 11, in which when installing the supporting assembly 100, the fixing end 132 of the latching post 130 inserts into the inserting hole 31 on the outer surface 35 of the case 3, so as to fix the latching post 130 to the outer surface 35 of the case 3 through the fixing end 132, the fixing end 132 is located in the trough 37. Next, the support body 150 is placed on the outer surface 35 of the case 3 with the combination side 154 facing the trough 37 and the combination hole 156 aligned with the inserting end 134. When pressing the support body 150 against the case 3, the inserting end 134 moves into the combination hole 156. When the support body 150 is combined with the latching post 130, the inserting hole 31 and the latching post 130 are covered by the support body 150, so as to avoid the structure that negatively affects the appearance outer surface 35 of the case 3 from being exposed.

Please refer to FIGS. 10 and 11, in which the case 3 further includes a fourth stopping block 39 protruding at the edge of the opening of the trough 37. The configuration of the opening of the trough 37 matches the configuration of the cross section of the lug-boss 151. The third stopping block 155 is used for running over the fourth stopping block 39 and pressing against the fourth stopping block 39. Through the third stopping block 155, the support body 150 tightly contacts the outer surface 35 of the case 3, and the occurrence rate of edge warping on the edge of the support body 150 is reduced.

Through the deformable support body 150 combined with the latching post 130, the support body 150 is able to be installed or removed, so as to form the supporting assembly. The support body 150 is combined with the latching post 130 through the deformation of the support body 150, so tools are not required when installing to or removing the supporting body from the case, and the problem of damaging the support body when removing the support body is avoided efficiently. Furthermore, the support body 150 covers the other parts of the supporting assembly 100, so as to avoid the structure that negatively affects the appearance of the case 2, 3, from being exposed.

While the present invention has been described by the way of example and in terms of the embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A supporting assembly comprising:
a case of an electronic device, including a window therein to communicate between an inner surface and an outer surface of the case, wherein a raised lip is formed on the inner surface of the case, the raised lip surrounding the window;

a fixed part disposed on the inner surface of the case and located corresponding to the window;

a latching post comprising a fixing end and an inserting end, wherein the fixing end is configured to run through the window from the outer surface of the case and is fixed to the fixed part and a first stopping block is protrudly disposed on the inserting end; and a support body comprising a supporting side and a combination side opposite to each other, wherein a combination hole is formed at the combination side for the inserting end of the latching post to be inserted therein, and the support body further comprises a second stopping block protrudly disposed on the inner wall of the combination hole for stopping the first stopping block of the latching post, so as to prevent the inserting end from escaping from the combination hole, wherein first and second depressions are formed on a bottom surface portion of the fixed part, the first depression is recessed upwards into the bottom surface portion, and the second depression is recessed upwards into the first depression such that a support shoulder is formed by the first and second depression, and a fixing hole is formed in a top portion of the second depression;

wherein the support body further comprises a lug-boss protruding on the combination side, and the combination hole is formed on the top of the lug-boss and extends into the support body, wherein a third stopping block is protrudly disposed at the edge of the top of the lug-boss, the opening of the first depression is larger than the window, and the third stopping block is configured to run through the window in the case of the electronic device and rest on the raised lip on the inner surface of the case of the electronic device; and wherein the third stopping block is received within the second depression, the support shoulder sits on the raised lip such that the bottom surface portion of the fixed part faces the inner surface of the case, and a gap is formed between the bottom surface portion of the fixed part and the inner surface of the case such that the bottom surface portion of the fixed part does not contact the inner surface of the case.

2. The supporting assembly as claimed in claim 1, wherein the support body is made of elastic material.

3. The support assembly as claimed in claim 2, wherein the equivalent diameter of the latching post obtained around the first stopping block is larger than the equivalent diameter obtained around the other portion of the latching post.

4. The support assembly as claimed in claim 1, wherein a cut-through slot is formed on the support body and the cut-through slot separates the lug-boss into two parts by cutting the lug-boss along an axial direction of the combination hole.

5. The support assembly as claimed in claim 1, wherein the lug-boss further comprises a plurality of ribs connecting the third stopping block and the combination side.

\* \* \* \* \*